(12) United States Patent
Kudo

(10) Patent No.: US 6,982,222 B2
(45) Date of Patent: Jan. 3, 2006

(54) METHOD OF GENERATING INTERCONNECTION PATTERN

(75) Inventor: Chiaki Kudo, Amagasaki (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 10/923,869

(22) Filed: Aug. 24, 2004

(65) Prior Publication Data

US 2005/0048764 A1 Mar. 3, 2005

(30) Foreign Application Priority Data

Aug. 25, 2003 (JP) ............................. 2003-299464

(51) Int. Cl.
H01L 21/4763 (2006.01)
(52) U.S. Cl. ..................... 438/622; 438/618; 438/942
(58) Field of Classification Search ................ 438/622, 438/618, 717, 736, 737, 942, 955
See application file for complete search history.

(56) References Cited

U.S. PATENT DOCUMENTS

2004/0038547 A1 * 2/2004 Son et al. .................. 438/710

FOREIGN PATENT DOCUMENTS

JP 04107953 4/1992

* cited by examiner

Primary Examiner—David Nhu
(74) Attorney, Agent, or Firm—Stevens, Davis, Miller & Mosher, LLP

(57) ABSTRACT

In an interconnection mask pattern generation, there are suppressed a decrease in reliability of an interconnection and a decrease in manufacture yield, which are resulted from use of an interconnection pattern generated with single minimum line width data for a semiconductor device or the like. When a layout interconnection pattern on a mask for an interconnection which connects functional elements to each other being arranged based on logical circuit data is generated, an interconnection pattern based on the minimum line width data is generated, an interconnection pattern based on the minimum line spacing data is also generated, and an interconnection pattern arranging a new interconnection boundary in the middle of both of them is then generated to be used as a final interconnection pattern, so that the interconnection pattern width becomes properly thick in width, thereby making it possible to improve reliability of the interconnection and suppress a decrease in manufacturing yield.

2 Claims, 6 Drawing Sheets

METHOD OF GENERATING INTERCONNECTION PATTERN

BACKGROUND OF THE INVENTION

1. Field of the Invention

The present invention relates to a method of generating an interconnection pattern for a semiconductor integrated circuit or the like.

2. Description of the Prior Art

A conventional automatic interconnection pattern generation system mainly aims at achieving a high integration for a semiconductor device or the like. For this purpose, a functional element, such as a transistor or the like is arranged within every functional circuit block based on logical circuit data or the like, and connections between them are in turn performed by several interconnection layers (layer on photo mask). Furthermore, connections between the functional circuit blocks are also performed by several interconnection layers in a manner similar to that.

Generally, when the functional elements such as a transistor or the like are densely arranged, a circuit area of a semiconductor device or a liquid crystal device will become the smallest area, but as a layout on the interconnection layer, there may still be given room in area between interconnections or the like. And, in a conventional automatic interconnection pattern generation system, only one type of line width data has been prepared for every interconnection layer for each interconnection width, the pattern generation has been made using the interconnection of the prepared line width. However, since an allowable current density for ensuring reliability against such as electromigration has not been taken into consideration in using the interconnection for a long period of time in this method, interconnections with narrow line width have been automatically layouted even at a circuit where a large amount of current has flown, thereby causing harmful effects, such as electromigration, heat generation, or the like. For this reason, a Japanese Laid-Open Patent Application Publication No. 4-107953 discloses a method of changing an interconnection width by means of preparing load current data or the like in advance.

However, in the conventional art described above, although the interconnection width becomes wider in a portion where a large amount of current flows, a pattern generation employing a minimum dimension which has been specified on each interconnection layer in advance is performed in a portion where only a smaller amount of current flows with respect to the allowable current density. Thus, even when there has been still room in area in a portion where this interconnection pattern generation has been performed, there has been a case where a minimum line width has been employed. For the minimum line width, since the pattern width has been narrow, accuracy of interconnection pattern width on photo mask has been required, so that the mask making has been high in cost, resulting in an increase in cost of the semiconductor device or the like. In addition, for the minimum dimension, it has become easy to cause discontinuity and width reduction of the interconnection due to a decrease in a process margin in a photolithography process, resulting in a decrease in yield and quality of the semiconductor or the like.

SUMMARY OF THE INVENTION

It is an object of the present invention to provide an interconnection pattern generation method of avoiding needlessly using a minimum line width, and manufacturing an interconnection of a semiconductor device or the like with desirable yield by generating a pattern specified by the minimum line width and a pattern specified by a minimum line spacing, respectively, and generating a pattern to be actually used so as to become medium dimensions between them.

In order to achieve the above objects, an interconnection pattern generation method of a first invention is an interconnection pattern generation method of generating an interconnection pattern for a mask layout corresponding to an interconnection for connecting between a plurality of elements such as a transistor, a resistance, and a capacitance based on circuit data such as a circuit diagram, the interconnection pattern generation method includes the steps of: generating a first interconnection pattern corresponding to an interconnection with a line width according to minimum line width data, and an interconnection spacing determined by the minimum line width; generating a second interconnection pattern corresponding to an interconnection with a line spacing according to minimum line spacing data and a line width determined by the minimum line spacing; and generating a third interconnection pattern corresponding to an interconnection with a medium line width and a medium line spacing between the first and second interconnection patterns based on the first and second interconnection patterns to use the third interconnection pattern as an interconnection pattern for a mask layout.

According to this configuration, the first interconnection pattern according to the minimum line width and the second interconnection pattern specified by the minimum line spacing are generated, respectively, and the third interconnection pattern with the medium line width and the medium line spacing there between is generated, so that it is not formed with an unnecessary minimum dimension, thereby making it possible to prevent discontinuity or the like to improve reliability of the interconnection due to an increase in line width, and also to prevent a short circuit or the like due to an increase in line spacing. Thus, an improvement in manufacturing yield and quality of a semiconductor device can be achieved. In addition, a circuit area for interconnection can be effectively used by making the line width wider, and mask making cost is also suppressed, so that cost of a semiconductor device or the like can be suppressed.

An interconnection pattern generation method of a second invention is to adjust a boundary line so that the boundary line of the third interconnection pattern may be put on a grid for electron beam scanning used for mask making when the third interconnection pattern is generated.

DETAILED DESCRIPTION OF THE PREFERRED EMBODIMENTS

Figure 1:
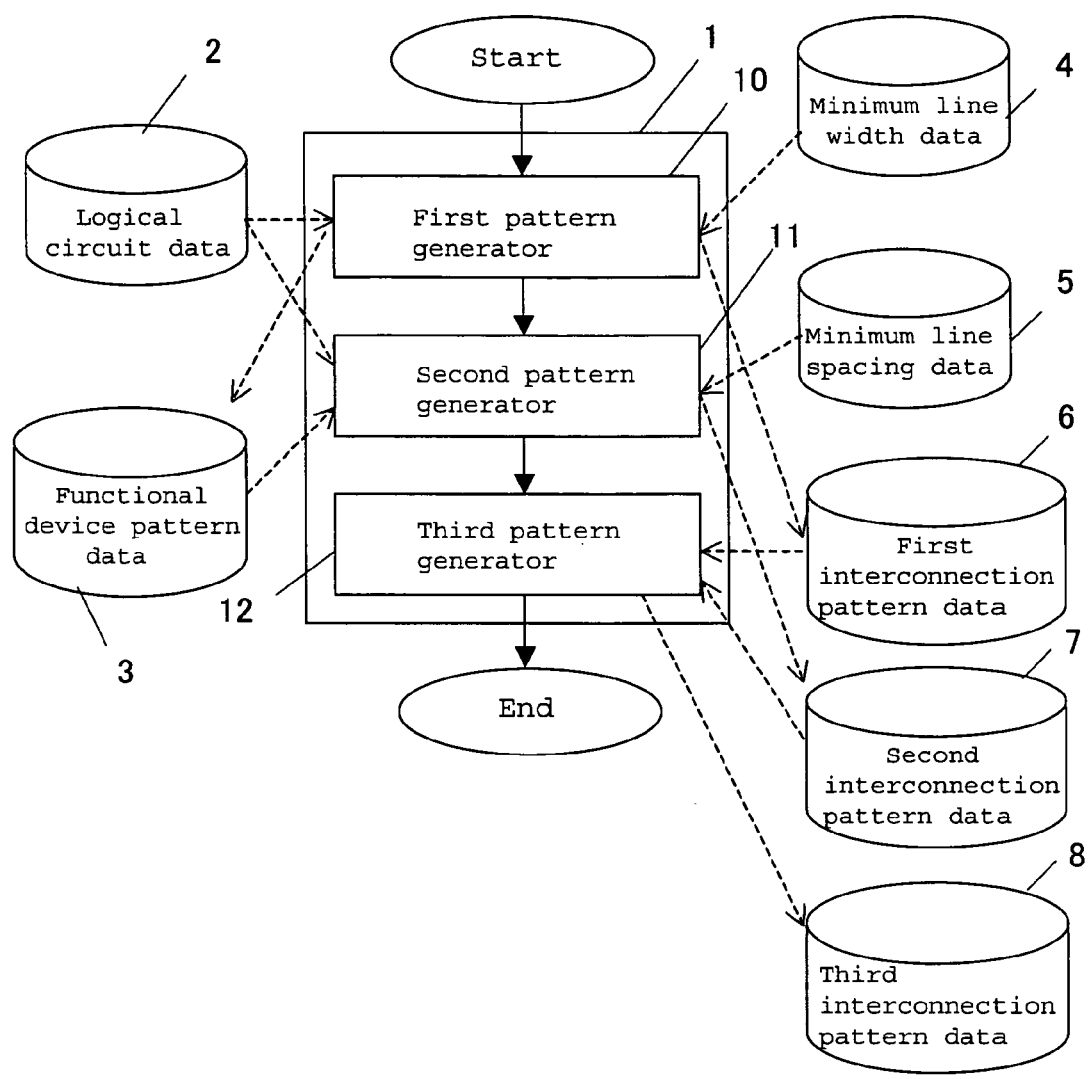
FIG. 1 is a block diagram of a pattern generation system in an embodiment of the present invention.

Hereafter, referring to the drawings, description will be made of embodiments according to the present invention. FIG. 1 is a system configuration view of an interconnection pattern generator 1 which comprises a computer, a database, or the like in the embodiment of the present invention.

In FIG. 1, the interconnection pattern generator 1 includes a first pattern generation means 10, a second pattern generation means 11, and a third pattern generation means 12, comprises a logical circuit data storage means 2, a functional element pattern data storage means 3, a minimum line width data storage means 4, a minimum line spacing data storage means 5, a first interconnection pattern data storage means 6, a second interconnection pattern data storage means 7, and a third interconnection pattern data storage means 8 at the outside or the inside thereof (FIG. 1 shows a case that means 2~8 are at the outside), wherein logical circuit data, functional element pattern data, minimum line width data, minimum line spacing data, first interconnection pattern data, second interconnection pattern data, and third interconnection pattern data are outputted from or inputted to the means 2~8. Incidentally, although dimension constraint data of a contact for connecting different interconnection layers and functional elements such as a transistor or the like is included in a pattern generation of a semiconductor circuit, those are omitted in FIG. 1, thereby simplifying the discussion.

Generally, in order to achieve performance of the functional element and achieve manufacturing yield and high quality in manufacturing a semiconductor device or the like, various dimension constraint data for generating the pattern are specified in advance. In order to generate an interconnection pattern, the minimum line width data and the minimum line spacing data are specified therein in advance. Incidentally, dimension data, such as overlapping of the interconnection with a contact pattern, may be specified other than that.

Figure 2:
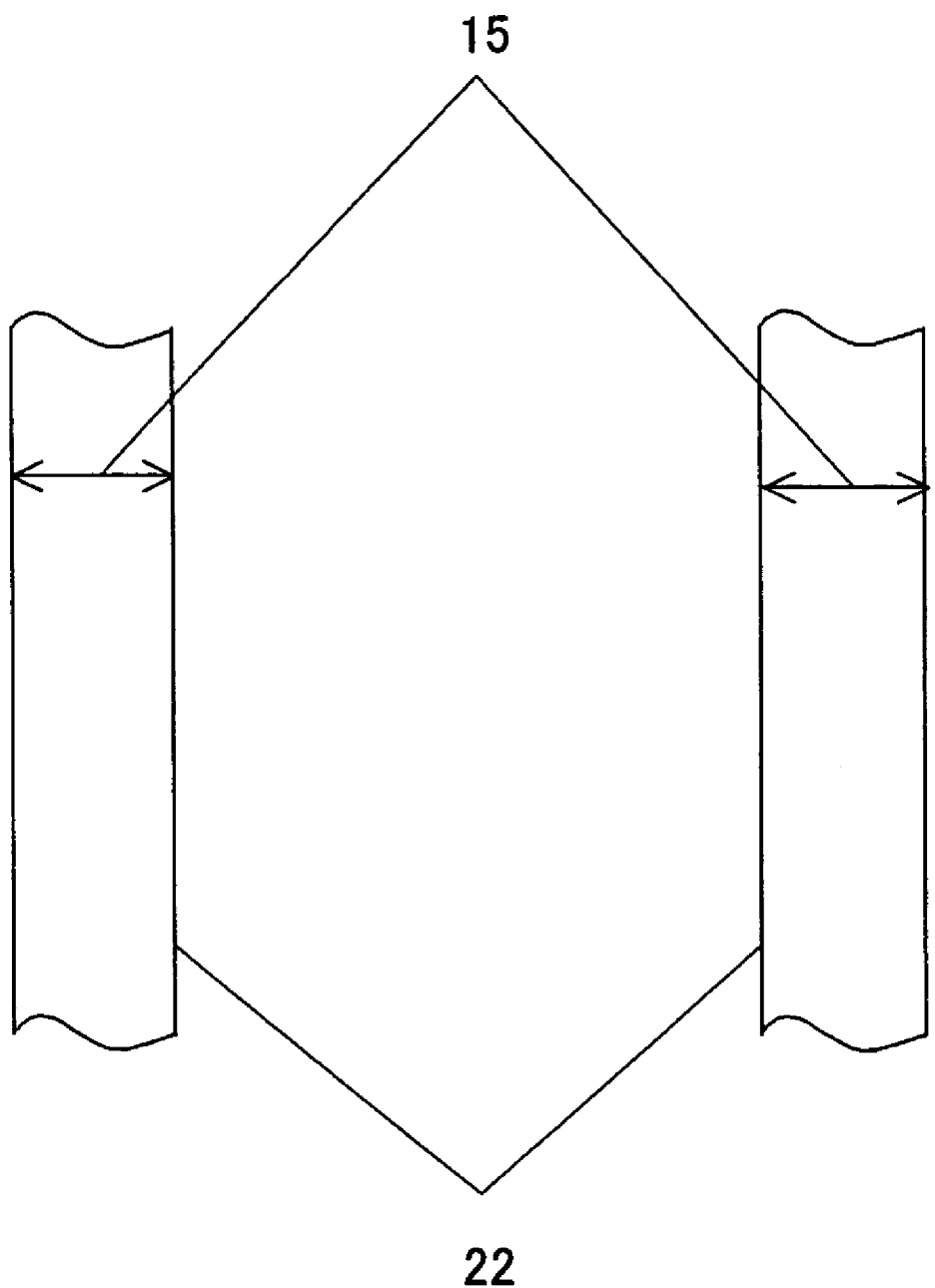
FIG. 2 is a view showing a first interconnection pattern generated in a minimum line width according to the embodiment of the present invention.

First, in FIG. 1, the logical circuit data stored in the logical circuit data storage means 2 and the minimum line width data stored in the minimum line width data storage means 4 are supplied into the first pattern generation means 10. This first pattern generation means 10 performs a process for generating a pattern of the functional element such as a transistor or the like, and a first interconnection pattern with the minimum line width based on the logical circuit data and the minimum line width data, and the resulting functional element pattern data and first interconnection pattern data are stored in the functional element pattern data storage means 3 and the first interconnection pattern data storage means 6, respectively. FIG. 2 is a view showing a case where a first interconnection pattern 22 is produced by the first interconnection pattern data with a minimum line width 15, and there are many cases where the functional element patterns are connected with the interconnection pattern shown in FIG. 2 after closely arranging those patterns in general. In this case, although the interconnection pattern will connect the nodes with each other of the functional elements with minimal length, there is a case where the space between the nodes of the functional elements is wider than a minimum line width+a minimum line spacing of the interconnection pattern, so that the interconnection spacing is automatically determined further widely than the minimum line spacing by means of arranging the interconnection pattern with the minimum line width in this area.

Figure 3:
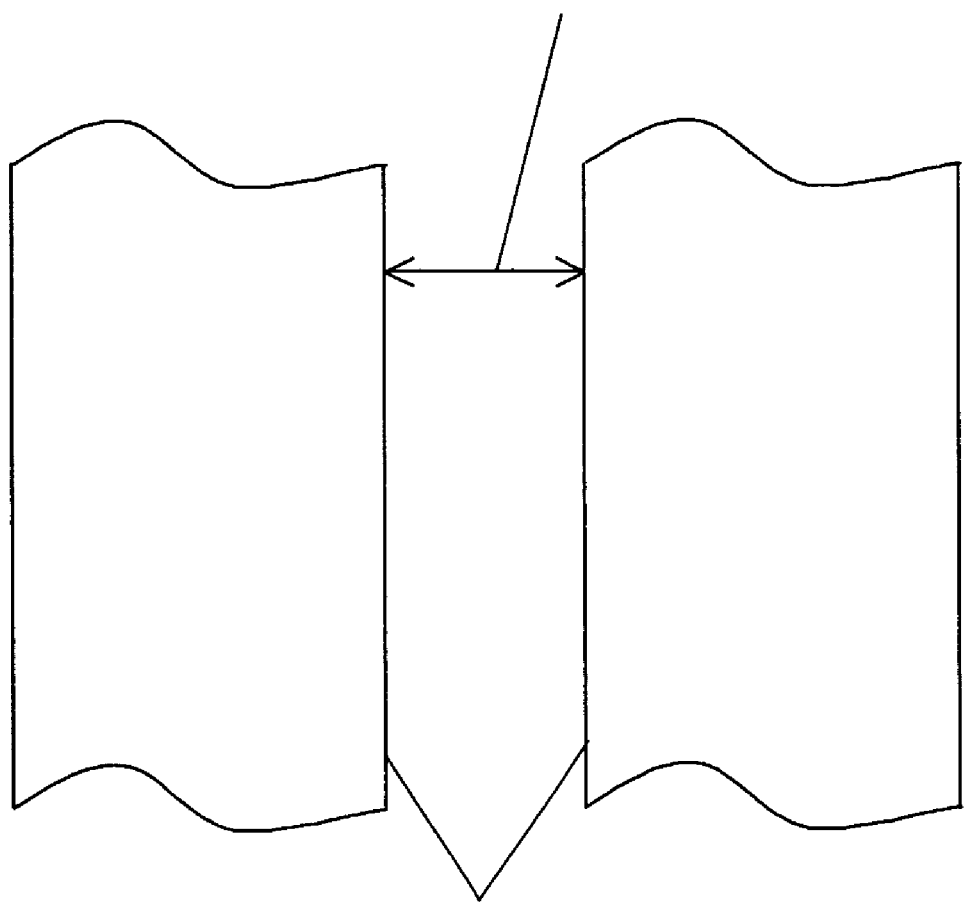
FIG. 3 is a view showing a second interconnection pattern generated in a minimum line spacing according to the embodiment of the present invention.

Next, referring to FIG. 1, the functional element pattern data which is created in the first pattern generation means 10 and stored in the functional element pattern data storage means 3, and the minimum line spacing data stored in the minimum line spacing data storage means 5 are supplied into the second pattern generation means 11, and the second pattern generation means 11 performs a process for generating a second interconnection pattern with the minimum line spacing, and the resulting second interconnection pattern data is stored in the second interconnection pattern data storage means 7. FIG. 3 is a case of the second interconnection pattern data where a second interconnection pattern 23 uses a minimum line spacing 16. When the spacing between the nodes of the connected functional element is wider than the minimum line width+the minimum line spacing of the interconnection pattern, the interconnection line width is automatically determined further widely than the minimum line width by means of arranging the interconnection pattern with the minimum line spacing in this portion.

Incidentally, the second pattern generation means 11, instead of receiving the functional element pattern data stored in the functional element pattern data storage means 3, may receive the logical circuit data stored in the logical circuit data storage means 2, and the functional element pattern data may be produced again to be used by the second pattern generation means 11.

Figure 4:
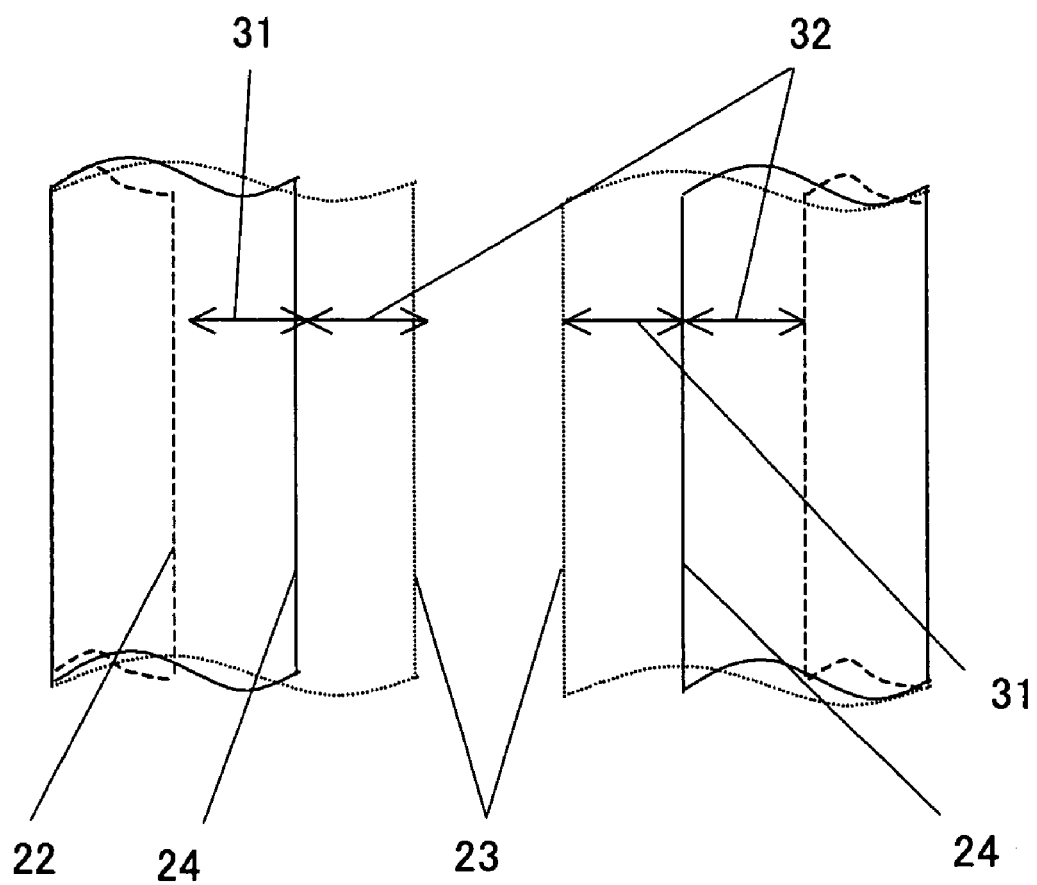
FIG. 4 is a view showing a third interconnection pattern generated according to the embodiment of the present invention.

Next, referring to FIG. 1, two interconnection pattern data stored in the first interconnection pattern data storage means 6 and the second interconnection pattern data storage means 7 are supplied into the third pattern generation means 12. The third pattern generation means 12 compares the line widths and line spacings of the two interconnection patterns described above, determines a line width and spacing of a third interconnection pattern to be an actual interconnection pattern so as to become in the middle of their dimensions, and stores it in the third interconnection pattern data storage means 8. This will be specifically described below. A third interconnection pattern 24 shown in FIG. 4 is the third interconnection pattern data to be used for an actual interconnection pattern, and it shows a case where an interconnection boundary is set in the middle of the first interconnection pattern and the second interconnection pattern so that a distance 31 from the first interconnection pattern and a distance 32 from the second interconnection pattern may become equal, and the third interconnection pattern is generated. Thus, an interconnection pattern with a medium line width and a medium spacing of the first and second interconnection patterns (22,23) can be generated, and the interconnection pattern with minimum line width and minimum line spacing found in the former interconnection patterns can be reduced.

Figure 5:
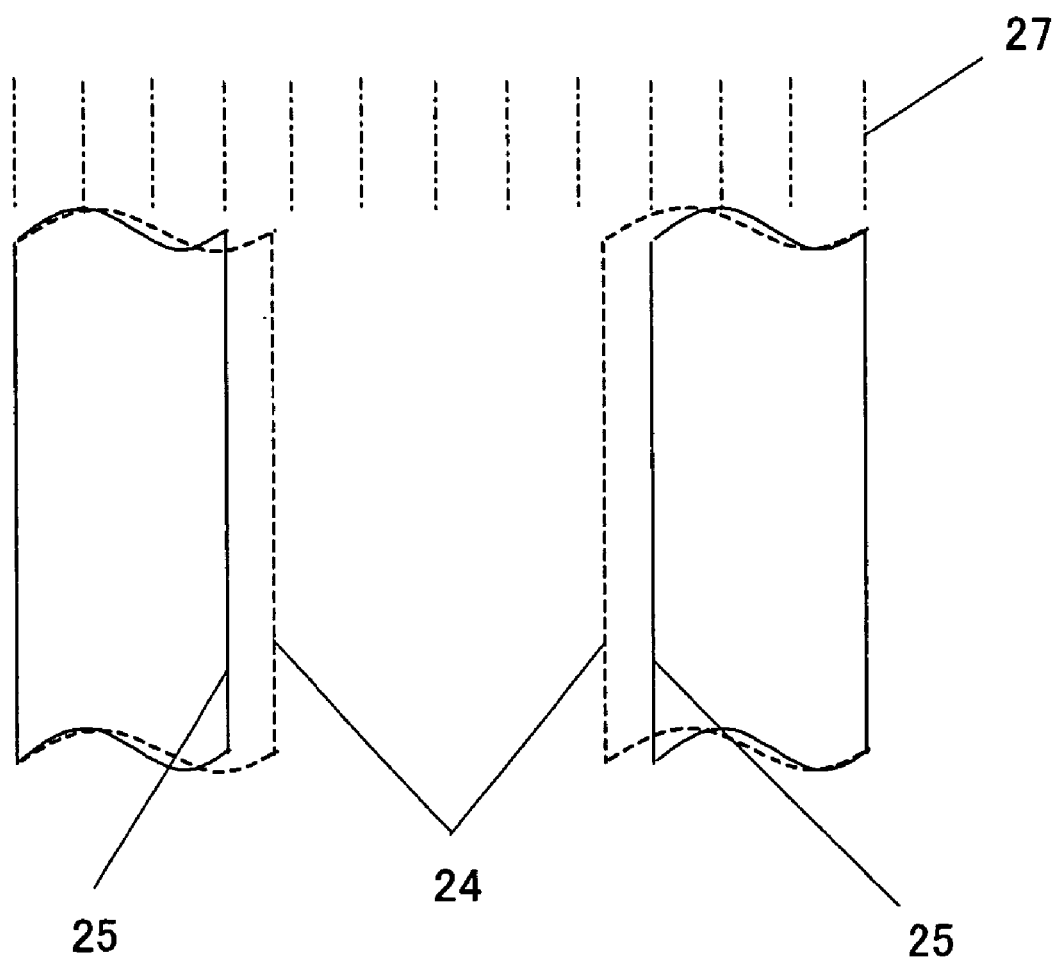
FIG. 5 is a view showing the third interconnection pattern after a boundary line adjustment according to the embodiment of the present invention.
Figure 6:
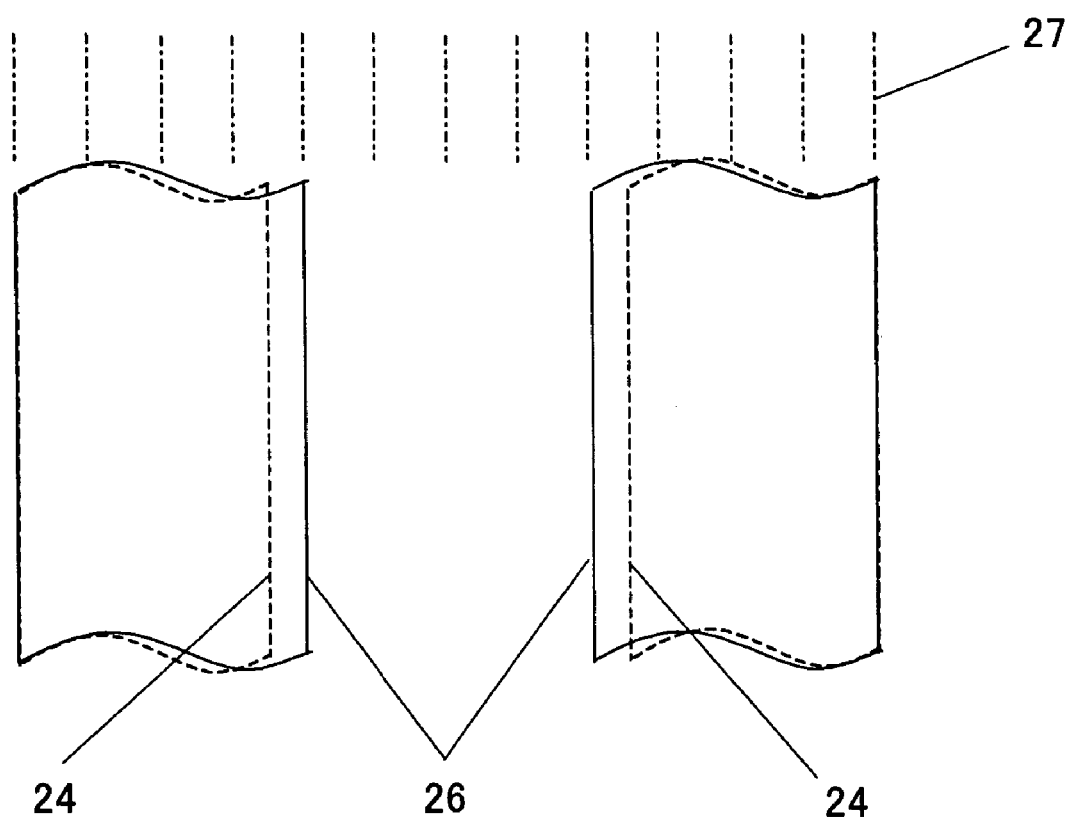
FIG. 6 is a view showing the third interconnection pattern after the boundary line adjustment according to the embodiment of the present invention.

In an actual interconnection pattern layout, there exists a pattern layout limitation area (grid 27) as shown in FIG. 5 and FIG. 6. This is based on a fact that a pattern not larger than a spot size of an electron beam cannot be created due to accuracy of an electron beam exposure system used for mask making, such as reticle and a mask making method relevant thereto. It is therefore necessary to put the boundary line of the third interconnection pattern 24 on the grid 27 which specifies this pattern layout limitation to be finely adjusted.

In a manufacturing process of the semiconductor integrated circuit device, when the minimum interconnection width and the minimum interconnection spacing coexist, a process margin with respect to either of them typically increases. When a process margin of the minimum interconnection width is larger, namely when the interconnection width is relatively wider, what is necessary is to move the boundary line of the third interconnection pattern 24 to the direction where the interconnection spacing is made wider from a location of the third interconnection pattern 24 in the third pattern generation means 12 as shown in FIG. 5 and just to put it on the grid 27 which is closest to the original boundary line, so that a formed interconnection pattern 25 becomes an interconnection pattern which is actually formed on a semiconductor substrate. On the contrary, when the process margin of the minimum interconnection spacing is larger, namely, when the interconnection spacing is relatively wider, what is necessary is to make the boundary line move in the direction so as to widen the interconnection width from the third interconnection pattern 24 in the third pattern generation means 12 as shown in FIG. 6, and to put it on the grid 27 closest to the original boundary line, so that the formed interconnection pattern 26 becomes an actual interconnection pattern. A fine adjustment operation onto this grid 27 is automatically performed, for example by the third pattern generation means 12 among the design systems shown in FIG. 1.

According to this embodiment as described above, when generating the interconnection pattern layout on the mask of the interconnection for connecting the functional elements with each other, the interconnection pattern 24 which arranges a new interconnection boundary in the middle between both of the boundary line of the interconnection pattern 22 with the minimum line width and the interconnection pattern 23 with the minimum line spacing is generated, so that reliability of the interconnection due to laying out the interconnection is not degraded by an unnecessary minimum line width in a manner similar to the conventional method, thereby making it possible to increase a manufacturing yield and quality of a semiconductor device. In addition, a circuit area for interconnection can be effectively used by means of making the line width wider, and mask making cost is also suppressed, thereby making it possible to suppress cost of a semiconductor device.

Incidentally, in this embodiment, although the interconnection pattern based on the minimum line spacing is generated after generating the interconnection pattern based on the minimum line width, it will be obvious that the order may be reversed.

In addition, although the pattern generation method described in the above embodiment is made an example of the interconnection pattern generation of a semiconductor device, it will be obvious that it is similarly applicable also to a pattern generation of another device, for example a liquid crystal device or the like. The present invention is not therefore limited to the aspect described in the above embodiment.

What is claimed is:

1. An interconnection pattern generation method of generating an interconnection pattern for a mask layout corresponding to an interconnection which connects between a plurality of elements based on circuit data, comprising the steps of:
   generating a first interconnection pattern corresponding to said interconnection with a line width according to minimum line width data and an interconnection spacing determined from said minimum line width;
   generating a second interconnection pattern corresponding to said interconnection with a line spacing according to a minimum line spacing data and a line width determined from said minimum line spacing; and
   generating a third interconnection pattern corresponding to said interconnection with a medium line width and a medium line spacing of said first and second interconnection patterns based on said first and second interconnection patterns to use said third interconnection pattern as said interconnection pattern for a mask layout.

2. An interconnection pattern generation method according to claim 1, wherein a boundary line is adjusted so that said boundary line of said third interconnection pattern may be put on a grid for electron beam exposure used for mask making when said third interconnection pattern is generated.

* * * * *